(12) United States Patent
Ashida et al.

(10) Patent No.: US 10,916,506 B2
(45) Date of Patent: Feb. 9, 2021

(54) SEMICONDUCTOR DEVICE

(71) Applicant: DENSO CORPORATION, Kariya (JP)

(72) Inventors: Youichi Ashida, Kariya (JP); Tsuyoshi Fujiwara, Kariya (JP)

(73) Assignee: DENSO CORPORATION, Kariya (JP)

( * ) Notice: Subject to any disclaimer, the term of this patent is extended or adjusted under 35 U.S.C. 154(b) by 11 days.

(21) Appl. No.: 16/355,917

(22) Filed: Mar. 18, 2019

(65) Prior Publication Data

US 2019/0214346 A1 Jul. 11, 2019

Related U.S. Application Data

(63) Continuation of application No. PCT/JP2017/030227, filed on Aug. 24, 2017.

(30) Foreign Application Priority Data

Oct. 14, 2016 (JP) .................. 2016-202787

(51) Int. Cl.
*H01L 23/522* (2006.01)
*H01L 23/528* (2006.01)
*H01L 21/768* (2006.01)
*H01L 23/532* (2006.01)
*H01L 21/3205* (2006.01)

(52) U.S. Cl.
CPC ...... *H01L 23/5329* (2013.01); *H01L 21/3205* (2013.01); *H01L 21/768* (2013.01); *H01L 23/522* (2013.01); *H01L 23/5226* (2013.01); *H01L 23/5227* (2013.01); *H01L 23/5283* (2013.01)

(58) Field of Classification Search
None
See application file for complete search history.

(56) References Cited

U.S. PATENT DOCUMENTS

| 6,659,663 B1 * | 12/2003 | Shirotori | ................... B41J 2/30 400/124.01 |
| 2002/0057936 A1 | 5/2002 | Shirotori et al. | |
| 2005/0280149 A1 | 12/2005 | Tsutsui et al. | |

(Continued)

FOREIGN PATENT DOCUMENTS

| JP | 2008-091454 A | 4/2008 |
| JP | 2008-147786 A | 6/2008 |
| JP | 2012-94593 A | 5/2012 |

*Primary Examiner* — Xiaoming Liu
(74) *Attorney, Agent, or Firm* — Posz Law Group, PLC

(57) ABSTRACT

A semiconductor device includes a semiconductor substrate, an interlayer dielectric film, a plurality of pad parts, a wiring layer, and a surface protection film. The semiconductor substrate includes a semiconductor element on a surface of the semiconductor substrate. The interlayer dielectric film is disposed on the surface of the semiconductor substrate. The wiring layer is disposed in the interlayer dielectric film. The hard film is disposed opposite to the semiconductor substrate with respect to the interlayer dielectric film, and is harder than the interlayer dielectric film. The pad parts are disposed opposite to the interlayer dielectric film with respect to the hard film. The surface protection film is disposed in at least an opposing region where the pad parts oppose to each other. The surface protection film is a silicon nitride film or a silicon oxide film.

10 Claims, 7 Drawing Sheets

(56) References Cited

U.S. PATENT DOCUMENTS

| | | | |
|---|---|---|---|
| 2010/0001363 A1* | 1/2010 | Frye | H01L 23/64 257/491 |
| 2013/0001785 A1 | 1/2013 | Nakao et al. | |
| 2014/0191421 A1* | 7/2014 | Sawada | H01L 24/11 257/784 |
| 2015/0206934 A1* | 7/2015 | Funaya | H01L 21/78 438/3 |
| 2016/0181184 A1 | 6/2016 | Matsumoto et al. | |
| 2018/0197753 A1 | 7/2018 | Matsumoto et al. | |

* cited by examiner

US 10,916,506 B2

SEMICONDUCTOR DEVICE

CROSS REFERENCE TO RELATED APPLICATIONS

The present application is a continuation application of International Patent Application No. PCT/JP2017/030227 filed on Aug. 24, 2017, which designated the U.S. and claims the benefit of priority from Japanese Patent Application No. 2016-202787 filed on Oct. 14, 2016. The entire disclosures of all of the above applications are incorporated herein by reference.

TECHNICAL FIELD

The present disclosure relates to a semiconductor device with a surface protection film.

BACKGROUND

There has been known a semiconductor device that includes a semiconductor substrate, an interlayer dielectric film, a hard film, a pad part, and a surface protection film. In such a semiconductor device, the semiconductor substrate has a semiconductor element, and the interlayer dielectric film is disposed on the semiconductor substrate. The hard film is disposed on the interlayer dielectric film, and the pad part is disposed on the first hard film and functions as an electrode for the semiconductor device. The surface protection film is disposed on a region of the pad part where bonding is not applied.

SUMMARY

The present disclosure provides a semiconductor device that includes a semiconductor substrate having a semiconductor element, an interlayer dielectric film on the semiconductor substrate, a hard film disposed opposite to the semiconductor substrate with respect to the interlayer dielectric film, pad parts disposed opposite to the interlayer dielectric film with respect to the hard film and connected to the semiconductor element via a wiring layer disposed in the interlayer dielectric film, and a surface protection film disposed at least in an opposing region between the pad parts.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
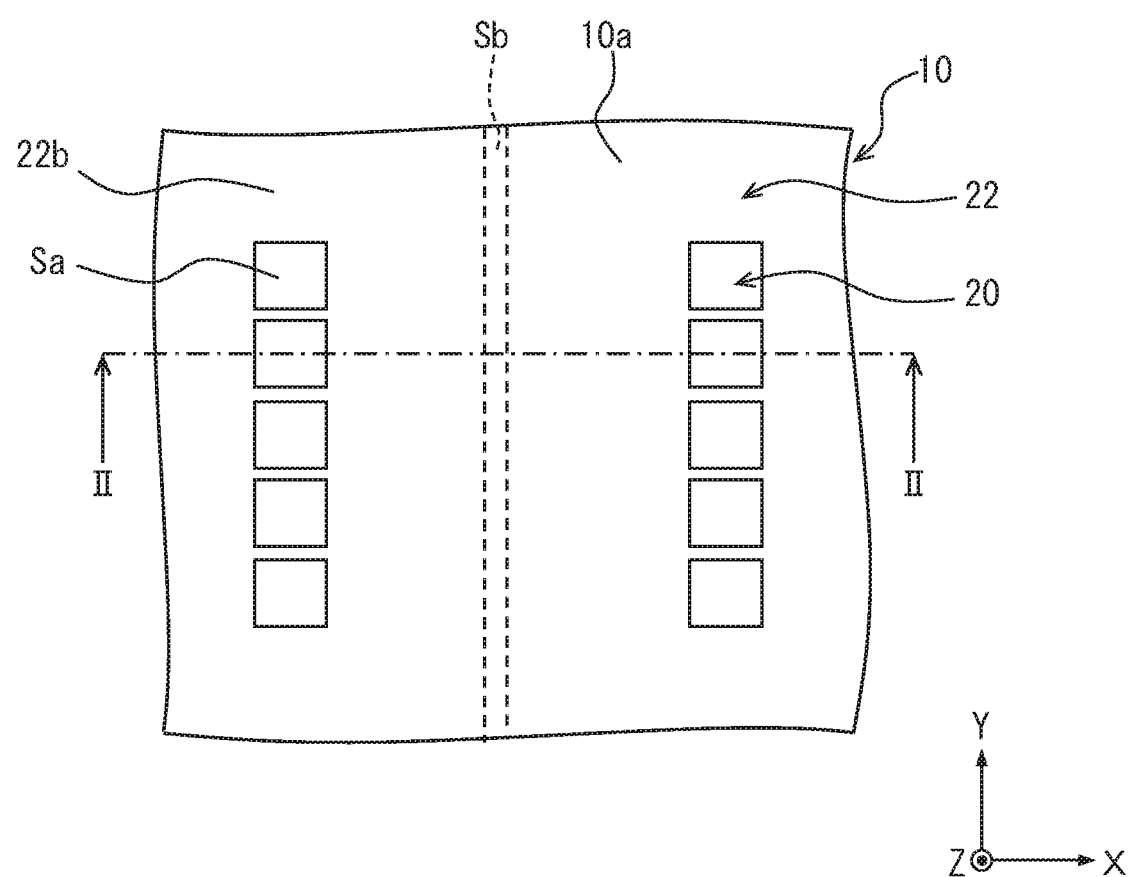
FIG. 1 is a plan view illustrating a schematic configuration of a semiconductor device according to a first embodiment.

For example, in a semiconductor device, a semiconductor substrate has a semiconductor element, and an interlayer dielectric film is disposed on the semiconductor substrate. A hard film is disposed on the interlayer dielectric film, and a pad part is disposed on the hard film as an electrode for the semiconductor device. Further, a surface protection film is disposed on a region of the pad part where bonding is not applied. The surface protection film is, for example, made of polyimide.

In such a semiconductor device, the temperature of the pad part may increase by an operation of the semiconductor element. The temperature increase promotes electromigration of the pad part. In a case where the semiconductor device includes a plurality of pad parts, the electromigration may cause the pad parts with different potentials to break a surface protection film, resulting in a short circuit between the pad parts.

According to a first aspect of the present disclosure, a semiconductor device includes: a semiconductor substrate that includes a semiconductor element on a surface; an interlayer dielectric film that is disposed on the surface of the semiconductor substrate; a wiring layer that is disposed in the interlayer dielectric film; a hard film that is disposed opposite to the semiconductor substrate with respect to the interlayer dielectric film and that is harder than the interlayer dielectric film; a plurality of pad parts for external connection that are disposed opposite to the interlayer dielectric film with respect to the hard film and that are connected via the wiring layer to the semiconductor element; and a surface protection film that has an electrical insulating property and is disposed at least in an opposing region where the pad parts oppose to each other. The surface protection film is a silicon nitride film or a silicon oxide film.

In the above configuration, since the surface protection film is a silicon nitride film or a silicon oxide film, the surface protection film is harder than a film made of polyimide. Moreover, the surface protection film is disposed at least in the opposing region where the pad parts oppose to each other. Consequently, even if the temperature of the pad parts increases due to the operation of the semiconductor element, the hard surface protection film restricts the pad parts from being deformed toward the opposing region. That is, the surface protection film can restricts the deformation of the pad parts due to electromigration. As a result, a short circuit between the pad parts due to the electromigration can be suppressed in the semiconductor device.

According to a second aspect of the present disclosure, a semiconductor device includes: a semiconductor substrate that includes a semiconductor element on a surface; an interlayer dielectric film that is disposed on the surface of the semiconductor substrate; a wiring layer that is disposed in the interlayer dielectric film; a hard film that is disposed opposite to the semiconductor substrate with respect to the interlayer dielectric film and that is harder than the interlayer dielectric film; a plurality of pad parts for external connection that are disposed opposite to the interlayer dielectric film with respect to the hard film and that are connected via the wiring layer to the semiconductor element; and a surface protection film that has an electrical insulating property and is disposed at least in an opposing region where the pad parts oppose to each other. The surface protection film includes an inner film and an outer film that is disposed opposite to the pad parts with respect to the inner film, and the inner film is harder than the outer film.

In the above configuration, the inner film is harder than the outer film. In addition, the inner film is disposed closer to the pad parts than the outer film, and is also disposed in the opposing region where the pad parts oppose to each other. Consequently, even if the temperature of the pad parts increases due to the operation of the semiconductor element, the hard inner film restricts the pad parts from being deformed toward the opposing region. As a result, a short circuit between the pad parts due to electromigration can be suppressed in the semiconductor device.

Embodiments of the present disclosure will be described with reference to the drawings. In the embodiments, the same reference numerals are given to common or related components. It is assumed that the thickness direction of a semiconductor substrate is a Z direction. It is assumed that a direction perpendicular to the Z direction is an X direction and a direction perpendicular to the Z direction and the X direction is a Y direction.

First Embodiment

Figure 2:
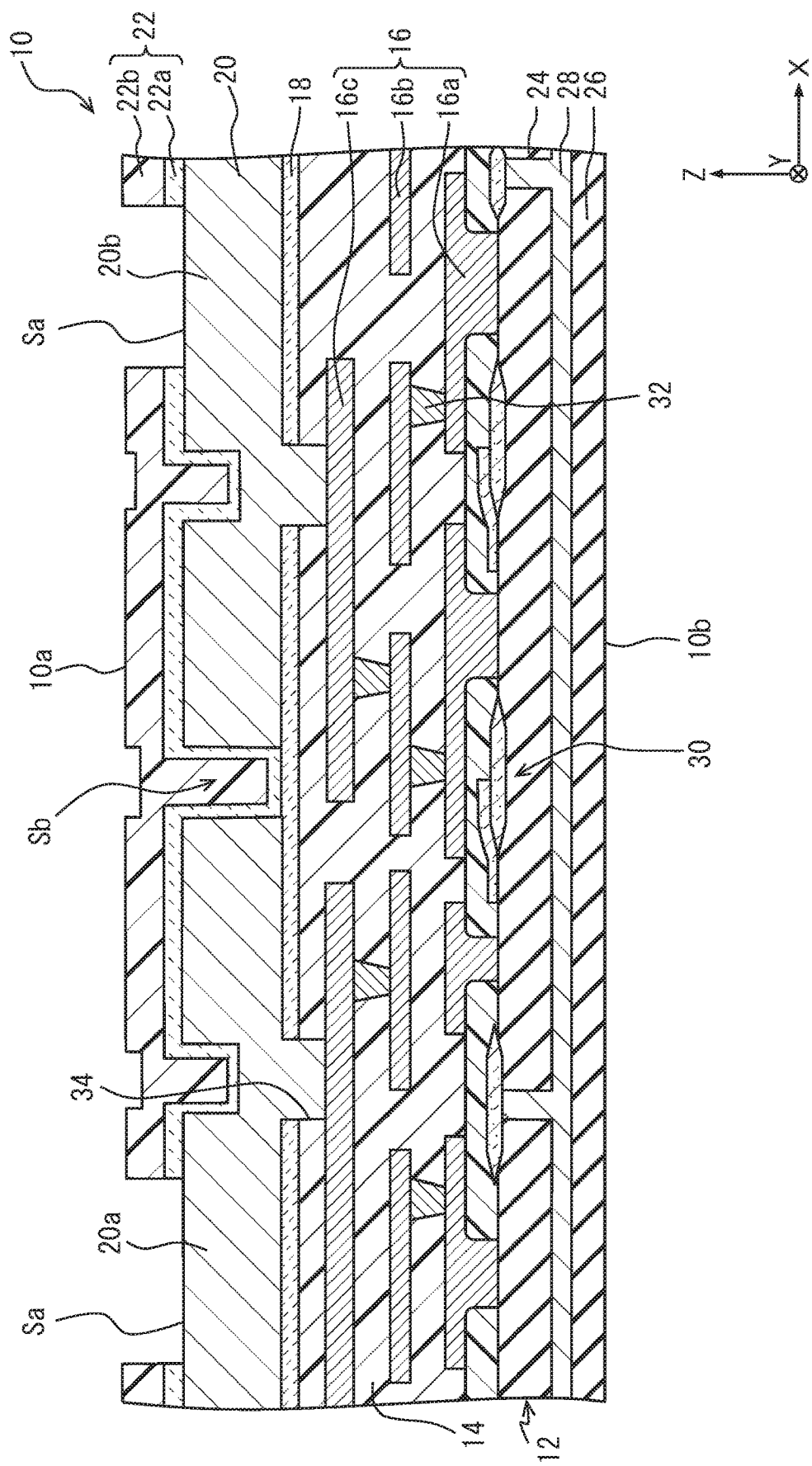
FIG. 2 is a cross-sectional view taken along a line II-II of FIG. 1.

A schematic configuration of a semiconductor device 10 will be described first with reference to FIGS. 1 to 3.

An IC chip can be used as the semiconductor device 10, for example. As illustrated in FIGS. 1 and 2, the semiconductor device 10 includes an SOI substrate 12 functioning as a semiconductor substrate, an interlayer dielectric film 14, a wiring layer 16, a hard film 18, a pad part 20, and a surface protection film 22. The semiconductor device 10 has a plate shape whose thickness direction extends along the Z direction. The semiconductor device 10 has a front surface 10a and a back surface 10b opposite to the front surface 10a.

Figure 3:
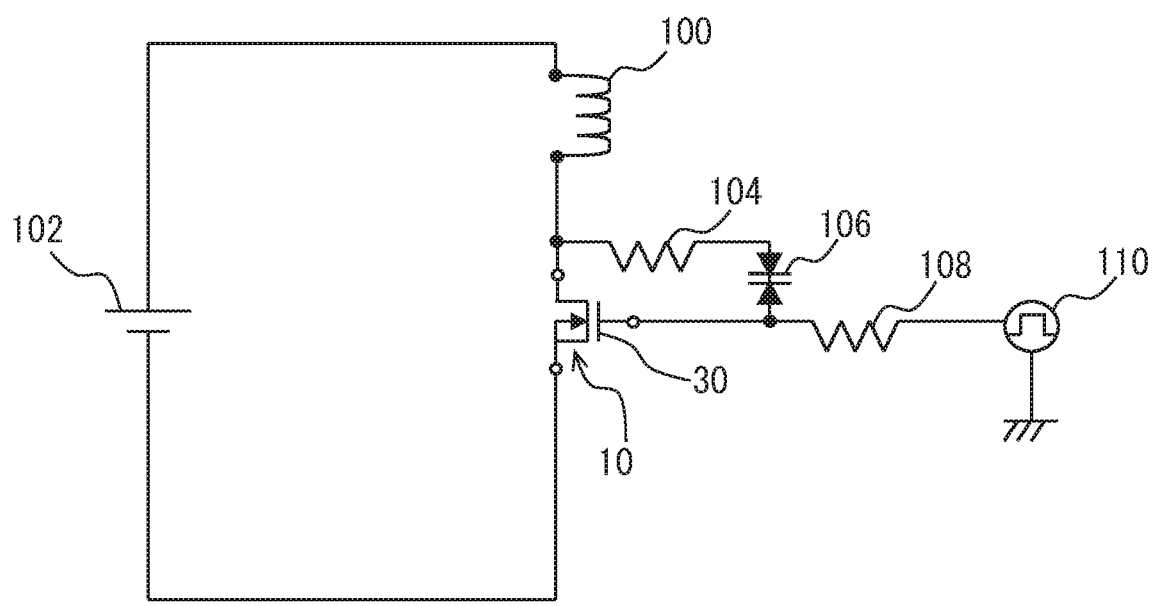
FIG. 3 is a circuit diagram illustrating a circuit for evaluating the semiconductor device.

As illustrated in FIG. 3, the semiconductor device 10 according to the present embodiment is electrically connected to an inductive load 100 to control a current flowing in the inductive load 100. The inductive load 100 may also be referred to as an L load or an inductance. Control of the inductive load 100 by the semiconductor device 10 will be described in detail below.

The SOI substrate 12 forms the back surface 10b. SOI is the abbreviation for Silicon On Insulator. The SOI substrate 12 includes an SOI layer 24, a support substrate 26, an embedded oxide film 28, and a semiconductor element 30. The SOI layer 24 is made of N-type silicon, for example. The support substrate 26 is made of P-type silicon, for example. The SOI layer 24 is joined to the support substrate 26 via the embedded oxide film 28.

The semiconductor element 30 is formed on one surface of the SOI substrate 12 opposite to the back surface 10b. The semiconductor element 30 is, for example, an LDMOS (Lateral Diffused MOS Transistor) or an IGBT (Insulated Gate Bipolar Transistor). A plurality of the semiconductor elements 30 are formed on the SOI substrate 12. The interlayer dielectric film 14 is formed on the surface of the SOI substrate 12 opposite to the back surface 10b.

The interlayer dielectric film 14 is made of, for example, an SOG (Spin On Glass) film, a boro-phospho-silicate glass (BPSG) film, or a tetraethoxysilane (TEOS) film. The Young's modulus of the interlayer dielectric film 14 is approximately 70 GPa, for example. The wiring layer 16 is disposed in the interlayer dielectric film 14.

In the interlayer dielectric film 14 of the present embodiment, a first wiring layer 16a, a second wiring layer 16b, and a third wiring layer 16c are disposed as the wiring layer 16 in this order from a side of the SOI layer 24. The number of layers of the wiring layer 16 is not limited to this case. The wiring layer 16 is made of aluminum, for example. A plurality of vias 32 for connecting the wiring layers 16 are also formed in the interlayer dielectric film 14. The hard film 18 is formed on a side of the interlayer dielectric film 14 opposite to a side on which the SOI substrate 12 is formed in the Z direction.

The hard film 18 is a passivation film that is harder than a member that mainly constitutes the interlayer dielectric film 14. The hard film 18 is made of a silicon nitride film, for example. The Young's modulus of the hard film 18 is approximately 240 GPa, for example. The hard film 18 is formed by, for example, plasma CVD. The thickness of the hard film 18 is approximately 1.0 μm, for example.

The hard film 18 blocks moisture from outside of the semiconductor device 10 and protects the wiring layer 16 and the SOI substrate 12 from the moisture. The pad part 20 is disposed on a side of the hard film 18 opposite to a side on which the interlayer dielectric film 14 is formed in the Z direction.

The pad part 20 is an electrode for external connection. The pad part 20 is electrically connected via the wiring layer 16 to the semiconductor element 30. The pad part 20 is made of metal such as aluminum and aluminum alloy. The Young's modulus of the pad part 20 is approximately 80 GPa, for example. As described above, the pad part 20 is disposed via the hard film 18 on the SOI substrate 12, the wiring layer 16, and the interlayer dielectric film 14.

A contact hole 34 is formed in the hard film 18 and the interlayer dielectric film 14 for the purpose of electrically connecting the pad part 20 to the third wiring layer 16c. The contact hole 34 is formed to penetrate the hard film 18 in the Z direction and reach the third wiring layer 16c with a predetermined depth to the interlayer dielectric film 14 in the Z direction. The pad part 20 is disposed not only in a surface of the hard film 18 opposite to the interlayer dielectric film 14 but also in the contact hole 34.

A plurality of the pad parts 20 are arranged in the semiconductor device 10. For example, different voltages are applied to the pad parts 20 arranged at different positions. FIG. 2 illustrates, as the pad parts 20, a first pad part 20a connected to the ground and a second pad part 20b connected to the inductive load 100.

The first pad part 20a and the second pad part 20b are arranged so as not to contact with each other. That is, there is a region where no pad part 20 is formed on the hard film 18. In the present embodiment, the first pad part 20a opposes the second pad part 20b in the X direction. An opposing region Sb is formed between the first pad part 20a and the second pad part 20b. As illustrated in FIG. 1, the opposing region Sb is formed to extend in the Y direction. The surface protection film 22 is formed on a side of the pad part 20 opposite to a side on which the hard film 18 is formed in the Z direction.

The surface protection film 22 restricts a short circuit between the pad parts 20 when foreign matter adheres to the front surface 10a of the semiconductor device 10. The surface protection film 22 partially covers the pad parts 20 and forms a part of the front surface 10a. The surface protection film 22 is made of a material that has excellent electrical insulating property. Each pad part 20 has a portion covered by the surface protection film 22 and a portion that is exposed from the surface protection film 22 and forms a part of the front surface 10a. The portion of the pad part 20 that is exposed from the surface protection film 22 is connected to the inductive load 100 or the ground by bonding. Hereinafter, the region of the pad part 20 that is exposed from the surface protection film 22 is referred to as "bonding region Sa" or an exposed region.

In a projection view in the Z direction, the bonding region Sa overlaps with at least a part of the region of the SOI substrate 12 where the semiconductor element 30 is formed. That is, the pad part 20 is a pad on element.

In the pad on element, bonding stress is easily transmitted to the semiconductor element 30. When bonding is applied on the pad part 20, it is possible to restrict the bonding stress from being transmitted toward the interlayer dielectric film 14, because the hard film 18 is interposed between the pad part 20 and the interlayer dielectric film 14. That is, the hard film 18 can inhibit the bonding stress from being transmitted to the semiconductor element 30. It is thus possible to reduce a bonding damage on the semiconductor element 30. Moreover, it is possible to suppress an occurrence of cracks in the semiconductor device 10.

The surface protection film 22 is also formed in the opposing region Sb. A part of the surface protection film 22 is disposed in the entire opposing region Sb and contacts with the pad part 20 and the hard film 18. The surface protection film 22 includes an inner film 22a that is disposed to contact with the pad part 20 and an outer film 22b that is disposed on a side of the inner film 22a opposite to the pad part 20 in the Z direction.

The inner film 22a is a passivation film that is harder than the outer film 22b, The Young's modulus of the inner film 22a is larger than or equal to 50 GPa, for example. The Young's modulus of the inner film 22a is approximately 240 GPa, for example, in the present embodiment. The inner film 22a is made of a silicon oxide film ($SiO_2$, SiO) or a silicon nitride film (SiN). That is to say, the main component of the inner film 22a is the silicon oxide film or the silicon nitride film.

When the hard film 18 is disposed between the pad part 20 and the interlayer dielectric film 14, the hard film 18 can reduce bonding stress. However, the hard film 18 is not disposed on the pad part 20, and thus the hard film 18 cannot restrict electromigration of the pad part 20. In contrast, since the inner film 22a is a hard film, the electromigration of the pad part 20 can be restricted.

The electromigration is a phenomenon in which metal is deformed by ion movements. In the present embodiment, the thickness of the inner film 22a is larger than or equal to 1.0 μm.

The outer film 22b is made of a material that is more flexible than the inner film 22a. The outer film 22b is made of polyimide, for example. The outer film 22b forms a part of the front surface 10a. The Young's modulus of the outer film 22b is a few GPa, for example.

Next, a manufacturing method of the semiconductor device 10 will be described.

An SOI substrate that includes a plurality of the semiconductor elements 30 on a surface is prepared first. The semiconductor element 30 is formed by any known method. The wiring layer 16 and the interlayer dielectric film 14 are then formed on the semiconductor elements 30. For example, each wiring layer 16 is formed by depositing aluminum using sputtering or the like. For example, the interlayer dielectric film 14 is formed by CVD or the like.

Next, a silicon nitride film is deposited on the interlayer dielectric film 14 by plasma CVD or the like, so that the hard film 18 is formed. The contact hole 34 is then formed in a region of the hard film 18 and the interlayer dielectric film 14, which does not overlap with the bonding region Sa in the projection view in the Z direction.

Next, the pad part 20 is formed on the hard film 18 by depositing aluminum using sputtering or the like. The inner film 22a is then deposited on the pad part 20 by plasma CVD or the like. Next, unnecessary portions of the inner film 22a are removed using a mask so that the bonding region Sa of the pad part 20 is exposed from the inner film 22a. The outer film 22b is then formed on the inner film 22a. In this way, the semiconductor device 10 is manufactured.

Next, thermal stress that acts on the semiconductor device 10 by controlling the inductive load 100 will be described with reference to FIGS. 3 to 6. While FIGS. 4 and 5 indicate a plurality of signals on the same vertical axis, the respective signals have different origins and scales. In driving the inductive load 100 by the semiconductor device 10 using the circuit illustrated in FIG. 3, thermal stress that acts on the semiconductor device 10 was evaluated.

In the circuit illustrated in FIG. 3, one end of the inductive load 100 is connected to a positive electrode of a power supply 102 whereas the other end of the inductive load 100 is connected to the semiconductor device 10. Specifically, the other end of the inductive load 100 is connected via the second pad part 20b to a drain of the semiconductor element 30. A source of the semiconductor element 30 is connected via the first pad part 20a to a negative electrode of the power supply 102. The negative electrode of the power supply 102 is connected to the ground.

A connection point of the inductive load 100 and the semiconductor device 10 is connected via a resistor 104 to an end of a bidirectional zener diode 106. The other end of the bidirectional zener diode 106 opposite to the resistor 104 is connected to a gate of the semiconductor element 30. A connection point of the bidirectional zener diode 106 and the semiconductor element 30 is connected via a resistor 108 to a pulse power supply 110. The pulse power supply 110 is connected via the resistor 108 to the gate of the semiconductor element 30 and turns on and off the semiconductor element 30. The pulse power supply 110 controls a gate voltage Vg of the semiconductor element 30 by High or Low pulse signals.

Figure 4:
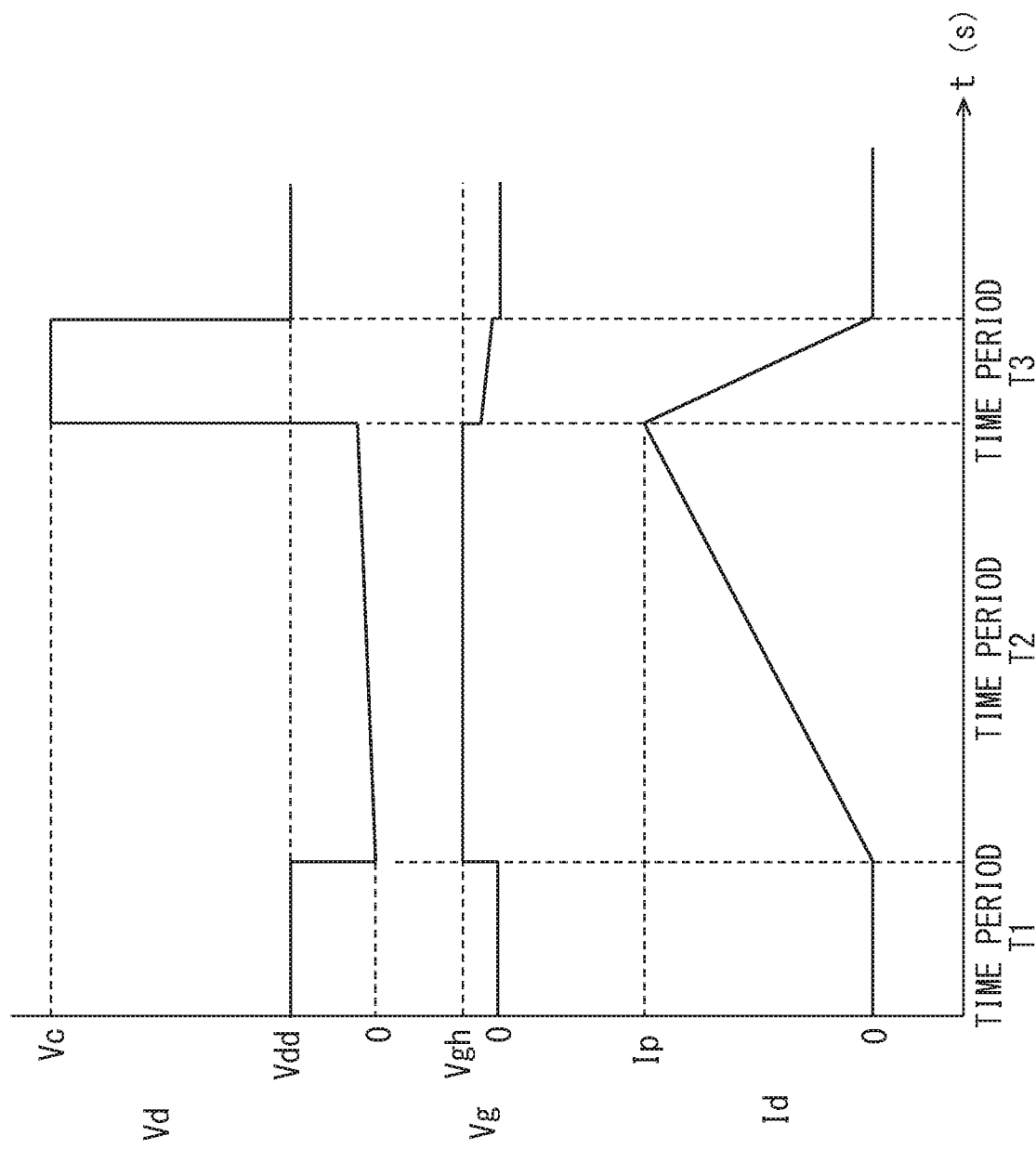
FIG. 4 is a timing chart illustrating a drain voltage, a gate voltage, and a drain current in a case where the semiconductor device is evaluated by using the circuit illustrated in FIG. 3.

As illustrated in FIG. 4, a pulse signal applied to the gate is Low and the gate is turned off during a time period T1. In FIG. 4, Vd denotes a drain voltage applied to the semiconductor element 30, Vg denotes a gate voltage, and Id denotes a drain current. The drain voltage Vd is fixed at Vdd during the time period T1. The drain current Id is 0. That is, no current flows in the semiconductor element 30.

When the time period T1 ends and a time period T2 starts, the pulse signal becomes High. The gate voltage Vg is thus changed to a voltage Vgh that is higher than the gate voltage during the time period T1, and then the gate is turned on. The drain current Id thus increases as the time elapses. During the time period T2, the drain voltage Vd is an on voltage that is determined by the drain current Id flowing in the semiconductor element 30.

Next, when the time period T2 ends and a time period T3 starts, the pulse signal becomes Low and the gate is turned off. The drain current Id is not blocked instantly by the inductive load 100 and decreases as the time elapses. During the time period T3, the drain voltage Vd is fixed at a fixed voltage Vc that is determined by the withstand voltage of the bidirectional zener diode 106. In the time period time period T3, the semiconductor element 30 generates heat according to the thermal energy of the inductive load 100 that corresponds to the product of the drain voltage Vd and the drain current Id.

One revolution is defined as an operation of the semiconductor device 10 over the time period T1, the time period T2, and the time period T3 in this order. In evaluating the semiconductor device 10, the semiconductor device 10 is operated to revolve a plurality of times as illustrated in FIG. 5.

Figure 5:
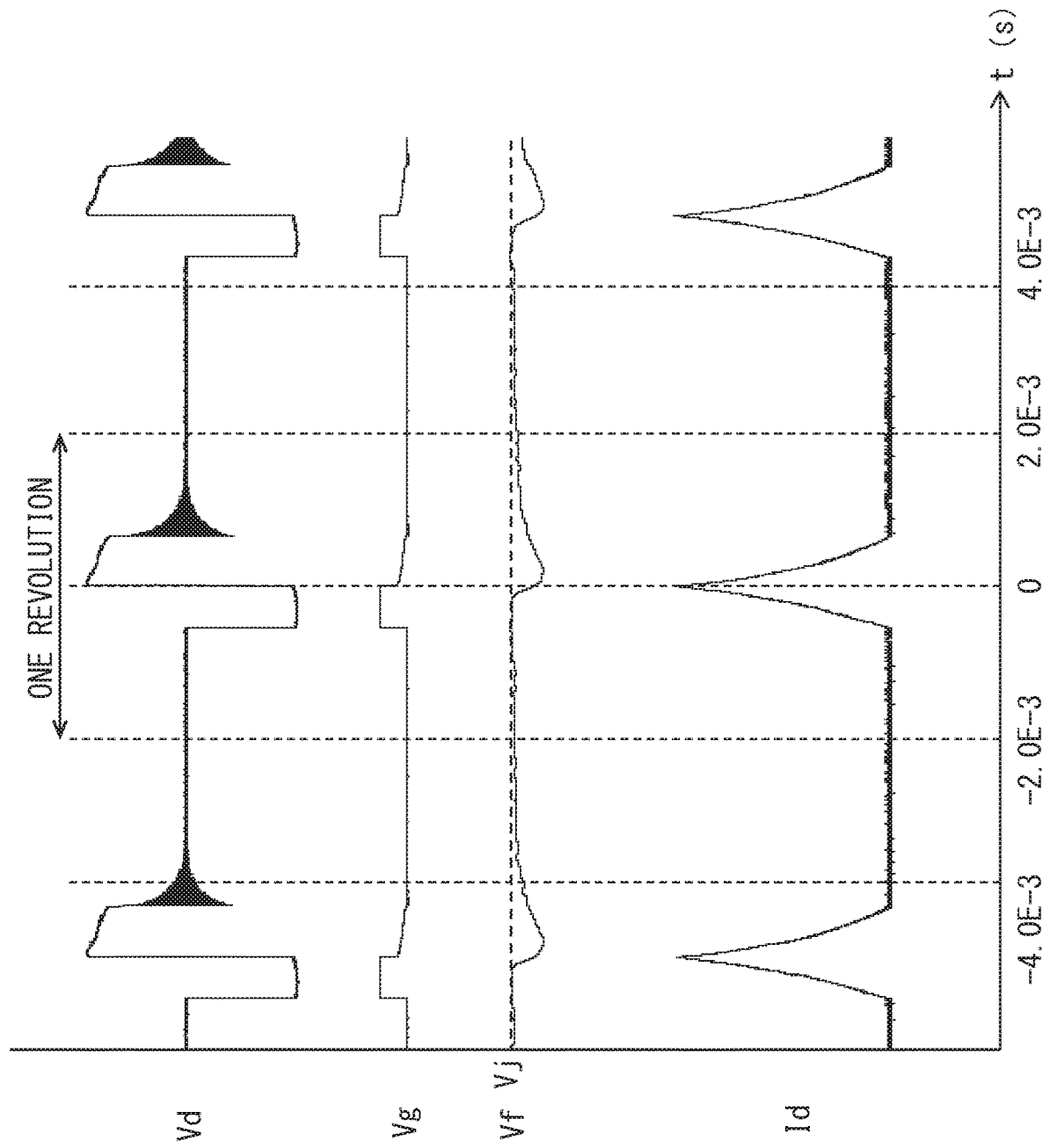
FIG. 5 is a timing chart illustrating the drain voltage, the gate voltage, a forward voltage, and the drain current in the case where the semiconductor device is evaluated by using the circuit illustrated in FIG. 3.

FIG. 5 indicates a forward voltage Vf of a temperature-sensitive diode placed near the semiconductor element 30, in addition to the drain voltage Vd, the gate voltage Vg, and the drain current Id. The forward voltage Vf indicates the temperature of the semiconductor element 30. Before the gate is turned off, the forward voltage Vf is a fixed value. When the gate is turned off, the temperature of the semiconductor element 30 increases and the forward voltage Vf decreases. When a predetermined time elapses since the gate is turned off, the forward voltage Vf returns to the fixed value that is the value before the gate is turned off.

Figure 6:
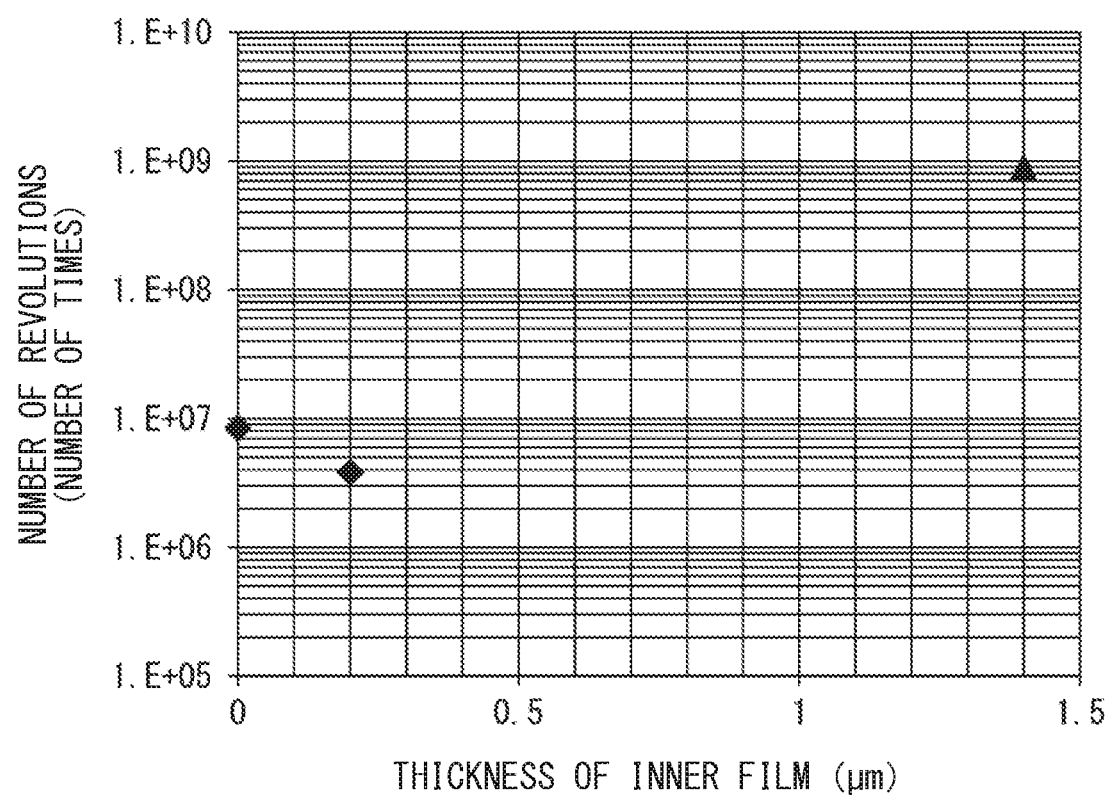
FIG. 6 is a graph illustrating an evaluation result of the semiconductor device in the case where the semiconductor device is evaluated by using the circuit of FIG. 3.

FIG. 6 illustrates an evaluation result of thermal stress that acts on the semiconductor device 10 when the thickness of the inner film 22a is changed. A rectangular marker in FIG. 6 indicates a value when a short circuit occurs between the pad parts 20. A triangular marker in FIG. 6 indicates a value when a short circuit does not occur between the pad parts 20. When the inner film 22a has a thickness of 0 µm, that is, when the inner film 22a is not formed, the number of revolutions is approximately $10^7$ and a short circuit occurs between the pad parts 20. When the inner film 22a has a thickness of 0.2 µm, the number of revolutions is between $10^6$ and $10^7$ and a short circuit occurs between the pad parts 20. In contrast, when the inner film 22a has a thickness of 1.4 µm, even when the number of revolutions is $10^9$, a short circuit does not occur between the pad parts 20.

Next, effects of the semiconductor device 10 will be described.

Since the inner film 22a of the present embodiment is a silicon nitride film or a silicon oxide film, the inner film is harder than a film made of polyimide. Moreover, the inner film 22a is disposed in the opposing region Sb where the pad parts 20 oppose to each other. With this configuration, even if the temperature of the pad part 20 increases due to the operation of the semiconductor element 30, the hard inner film 22a restricts the pad part 20 from being deformed toward the opposing region Sb. That is, the inner film 22a can restrict the deformation of the pad part 20 due to electromigration. Consequently, a short circuit between the pad parts 20 due to electromigration can be restricted in the semiconductor device 10.

Second Embodiment

In the present embodiment, the description of the first embodiment is applied to parts common to those of the semiconductor device 10 according to the first embodiment.

Figure 7:
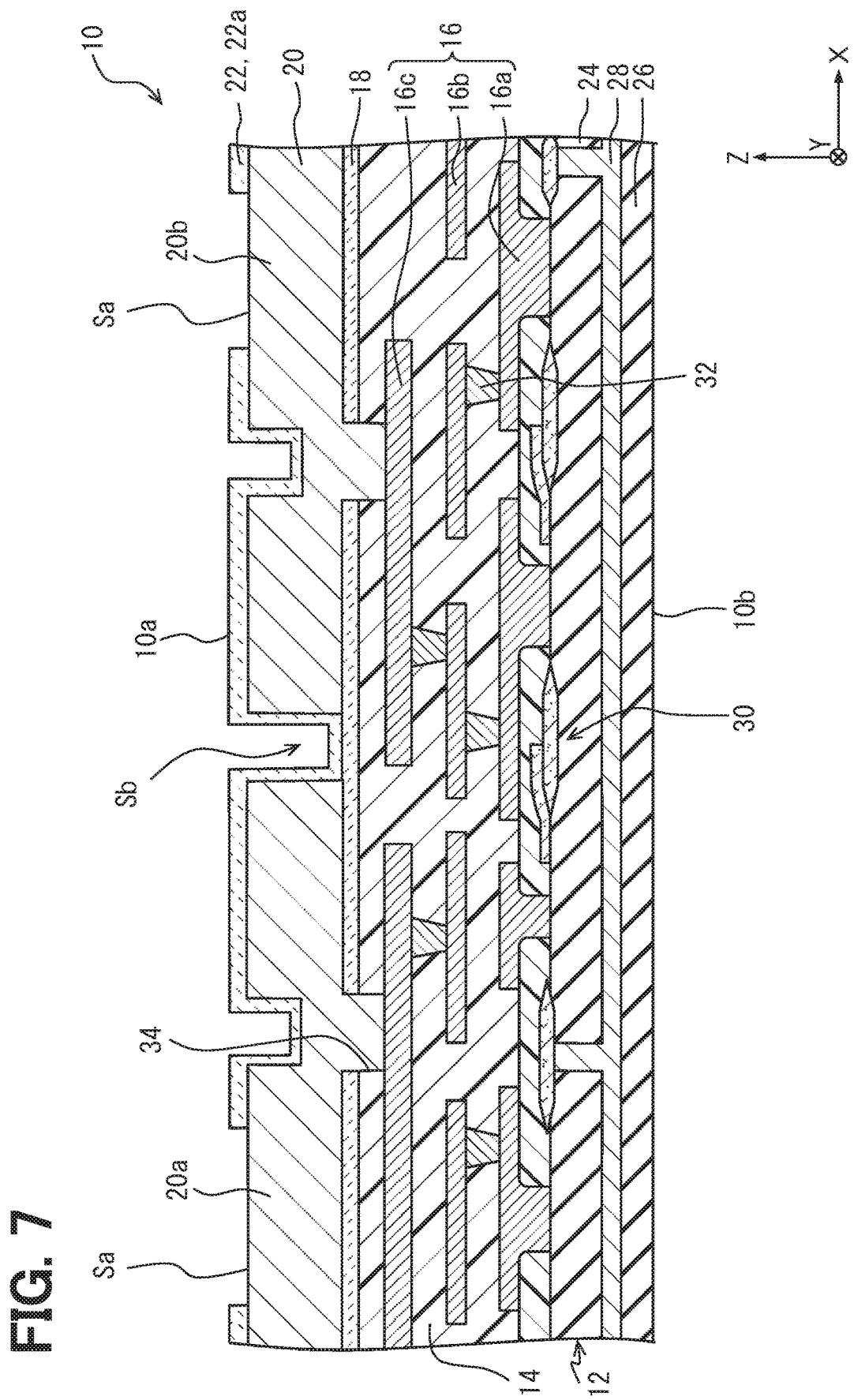
FIG. 7 is a cross-sectional view illustrating a schematic configuration of a semiconductor device according to a second embodiment.

In the present embodiment, the surface protection film 22 is a single layer as illustrated in FIG. 7. The surface protection film 22 is made of a silicon oxide film or a silicon nitride film. In the present embodiment, the surface protection film 22 does not include the outer film 22b that is significantly flexible. The silicon oxide film or the silicon nitride film is formed on the pad part 20 to form a part of the front surface 10a.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

While the above embodiments describe the example in which the semiconductor device 10 controls the inductive load 100, the present disclosure is not limited to this example. The semiconductor device 10 may control a current flowing in a resistive load, for example.

While the above embodiments describe the example in which the semiconductor device 10 includes the SOI substrate 12 as a semiconductor substrate, the present disclosure is not limited to this example. The semiconductor device 10 may include a bulk silicon substrate as a semiconductor substrate.

What is claimed is:

1. A semiconductor device comprising:
    a semiconductor substrate that includes a semiconductor element disposed on a surface of the semiconductor substrate;
    an interlayer dielectric film that is disposed on the surface of the semiconductor substrate;
    a wiring layer that is disposed in the interlayer dielectric film;
    a hard film that is disposed opposite to the semiconductor substrate with respect to the interlayer dielectric film and that is harder than the interlayer dielectric film;
    a plurality of pad parts for external connection that are disposed opposite to the interlayer dielectric film with respect to the hard film and that are connected via the wiring layer to the semiconductor element, the plurality of pad parts including a first pad part connected to a ground and a second pad part connected to an inductive load, the first pad part and the second pad part being opposed to each other in a planar direction of the surface of the semiconductor substrate to define an opposing region as a clearance therebetween; and
    a surface protection film that has an electrical insulating property and is disposed at least in the opposing region, wherein
    the surface protection film is a silicon nitride film or a silicon oxide film, and has a thickness of 1 µm or more, and
    the surface protection film includes first portions covering at least portions of surfaces of the first and second pad parts opposite to the hard film, second portions extending from the first portions and along opposing side surfaces of the first and second pad parts, and a third portion connecting between the second portions and being in contact with a part of the hard film exposed in the opposing region.

2. The semiconductor device according to claim 1, wherein
    at least one of the pad parts has an exposed region that is exposed from the surface protection film, and
    the exposed region is provided at a position that overlaps with a region where the semiconductor element is disposed in a projection view in a thickness direction of the semiconductor substrate.

3. The semiconductor device according to claim 1, wherein:
    the second pad part is electrically connected to the inductive load, and the semiconductor element is turned on and off to control a current flowing in the inductive load.

4. A semiconductor device comprising:
a semiconductor substrate that includes a semiconductor element disposed on a surface of the semiconductor substrate;
an interlayer dielectric film that is disposed on the surface of the semiconductor substrate;
a wiring layer that is disposed in the interlayer dielectric film;
a hard film that is disposed opposite to the semiconductor substrate with respect to the interlayer dielectric film and that is harder than the interlayer dielectric film;
a plurality of pad parts for external connection that are disposed opposite to the interlayer dielectric film with respect to the hard film and that are connected via the wiring layer to the semiconductor element, the plurality of pad parts including a first pad part and a second pad part being opposed to each other in a planar direction of the surface of the semiconductor substrate to define an opposing region as a clearance therebetween; and
a surface protection film that has an electrical insulating property and is disposed at least in the opposing region, wherein
the surface protection film includes an inner film and an outer film, the outer film being disposed opposite to the first and second pad parts with respect to the inner film,
the inner film has a thickness of 1 µm or more and is harder than the outer film, and
the inner film includes first portions covering at least portions of surfaces of the first and second pad parts opposite to the hard film, second portions extending from the first portions and along opposing side surfaces of the first and second pad parts, and a third portion connecting between the second portions and being in contact with a part of the hard film exposed in the opposing region.

5. The semiconductor device according to claim 4, wherein
the inner film is a silicon nitride film or a silicon oxide film.

6. The semiconductor device according to claim 4, wherein
at least one of the pad parts has an exposed region that is exposed from the surface protection film, and
the exposed region is provided at a position that overlaps with a region where the semiconductor element is disposed in a projection view in a thickness direction of the semiconductor substrate.

7. The semiconductor device according to claim 4, wherein:
the second pad part is electrically connected to the inductive load, and the semiconductor element is turned on and off to control a current flowing in the inductive load.

8. The semiconductor device according to claim 4, wherein
the surface protection film is disposed opposite to the hard film with respect to the first and second pad parts, and defines a top surface of the semiconductor device, and
the first and second pad parts are partly exposed from the surface protection film to define the top surface of the semiconductor device with the surface protection film and to define bonding regions for the external connection.

9. The semiconductor device according to claim 4, wherein
each of the first pad part and the second pad part has a plurality of exposed regions exposed from the surface protection film,
the plurality of exposed regions is aligned in an alignment direction orthogonal to an opposing direction in which the first pad part and the second pad part are opposed to each other, and
the opposing region extends in the alignment direction.

10. The semiconductor device according to claim 9, wherein
the surface protection film is disposed in an entirety of the opposing region.

* * * * *